(12) United States Patent
Kim

(10) Patent No.: US 11,373,954 B2
(45) Date of Patent: Jun. 28, 2022

(54) SEMICONDUCTOR PACKAGE

(71) Applicant: Samsung Electronics Co., Ltd., Suwon-si (KR)

(72) Inventor: Jongyoun Kim, Seoul (KR)

(73) Assignee: Samsung Electronics Co., Ltd.

(*) Notice: Subject to any disclaimer, the term of this patent is extended or adjusted under 35 U.S.C. 154(b) by 79 days.

(21) Appl. No.: 16/815,417

(22) Filed: Mar. 11, 2020

(65) Prior Publication Data

US 2021/0057344 A1 Feb. 25, 2021

(30) Foreign Application Priority Data

Aug. 21, 2019 (KR) .................. 10-2019-0102600

(51) Int. Cl.
*H01L 23/538* (2006.01)
*H01L 23/00* (2006.01)
*H01L 23/31* (2006.01)
*H01L 21/683* (2006.01)
*H01L 21/48* (2006.01)
*H01L 21/56* (2006.01)

(52) U.S. Cl.
CPC ...... *H01L 23/5386* (2013.01); *H01L 21/4853* (2013.01); *H01L 21/4857* (2013.01); *H01L 21/561* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 24/19* (2013.01); *H01L 24/20* (2013.01); *H01L 24/96* (2013.01); H01L 2221/68372 (2013.01); H01L 2224/224 (2013.01); H01L 2224/2205 (2013.01); H01L 2224/95001 (2013.01)

(58) Field of Classification Search
None
See application file for complete search history.

(56) References Cited

U.S. PATENT DOCUMENTS

| | | |
|---|---|---|
| 9,570,369 B1 | 2/2017 | Shih et al. |
| 9,589,841 B2 | 3/2017 | Chen et al. |
| 9,589,903 B2 | 3/2017 | Chen et al. |
| 9,818,684 B2 | 11/2017 | Hiner et al. |
| 9,947,626 B2 | 4/2018 | Chen et al. |
| 10,090,255 B2 | 10/2018 | Hedrick et al. |
| 2005/0196094 A1* | 9/2005 | Glebov .............. G02B 6/43 385/14 |
| 2006/0049527 A1* | 3/2006 | Hashimoto .......... H01L 24/32 257/773 |
| 2008/0237889 A1* | 10/2008 | Yang .............. H01L 25/0657 257/777 |
| 2016/0300804 A1 | 10/2016 | Omori |

(Continued)

FOREIGN PATENT DOCUMENTS

| | | |
|---|---|---|
| JP | 4401527 | 1/2010 |
| JP | 2019102861 | 6/2019 |

*Primary Examiner* — Jay C Chang
(74) *Attorney, Agent, or Firm* — Myers Bigel, P.A.

(57) ABSTRACT

A semiconductor package includes a redistribution layer, a semiconductor chip on the redistribution layer, and a molding layer covering a sidewall of the semiconductor chip and a top surface and a sidewall of the redistribution layer. The sidewall of the redistribution layer is inclined with respect to a bottom surface of the redistribution layer, and a sidewall of the molding layer is spaced apart from the sidewall of the redistribution layer.

17 Claims, 14 Drawing Sheets

(56) References Cited

U.S. PATENT DOCUMENTS

| | | | |
|---|---|---|---|
| 2017/0018590 A1* | 1/2017 | Yiu | H01L 24/19 |
| 2017/0053859 A1 | 2/2017 | Liang et al. | |
| 2017/0170154 A1* | 6/2017 | Ryu | H01L 25/03 |
| 2017/0229322 A1* | 8/2017 | Hsu | H01L 24/83 |
| 2018/0114770 A1 | 4/2018 | Huang et al. | |
| 2019/0006196 A1 | 1/2019 | Qu | |
| 2019/0166385 A1 | 5/2019 | Yamori | |
| 2019/0267330 A1* | 8/2019 | Takizawa | H01G 4/30 |
| 2020/0176378 A1* | 6/2020 | Wu | H01L 23/5283 |

* cited by examiner

SEMICONDUCTOR PACKAGE

CROSS-REFERENCE TO RELATED APPLICATION

This U.S. non-provisional patent application claims priority under 35 U.S.C. § 119 to Korean Patent Application No. 10-2019-0102600, filed on Aug. 21, 2019, in the Korean Intellectual Property Office, the disclosure of which is hereby incorporated by reference in its entirety.

BACKGROUND

Embodiments of the inventive concepts relate to a semiconductor package and, more particularly, to a semiconductor package with improved reliability.

An integrated circuit chip may be realized in the form of a semiconductor package so as to be appropriately applied to an electronic product. As the integration density of semiconductor chips (or integrated circuit chips) increases, it may be difficult to form a desired number of interconnection lines. To overcome these limitations, wafer-level packages and panel-level packages have been developed. The improvement of reliability of semiconductor packages may be required for excellent electrical connection between internal components of semiconductor packages and/or between semiconductor packages.

SUMMARY

Embodiments of the inventive concepts may provide a semiconductor package with improved reliability.

In an aspect, a semiconductor package may include a redistribution layer, a semiconductor chip on the redistribution layer, and a molding layer covering a sidewall of the semiconductor chip and a top surface and a sidewall of the redistribution layer. The sidewall of the redistribution layer may be inclined with respect to a bottom surface of the redistribution layer, and a sidewall of the molding layer may be spaced apart from the one sidewall of the redistribution layer.

In an aspect, a semiconductor package may include a redistribution layer, a semiconductor chip on the redistribution layer, and a molding layer covering a top surface and surrounding sidewalls of the semiconductor chip. An edge portion of the molding layer may cover sidewalls of the redistribution layer. Each of the sidewalls of the redistribution layer may form an acute inclination angle with a bottom surface of the redistribution layer.

In an aspect, a semiconductor package may include a redistribution layer, a semiconductor chip on the redistribution layer, solder bumps between the semiconductor chip and the redistribution layer, a molding layer covering sidewalls of the semiconductor chip and a top surface of the redistribution layer and surrounding sidewalls of the redistribution layer, and external terminals on a bottom surface of the redistribution layer. The sidewalls of the redistribution layer may include first to fourth sidewalls. The first to fourth sidewalls may be spaced apart from sidewalls of the molding layer. An angle between the bottom surface of the redistribution layer and each of the first to fourth sidewalls may be an acute angle. The semiconductor chip may be electrically connected to the external terminals through the redistribution layer. A bottom surface of an edge portion of the molding layer may be coplanar with the bottom surface of the redistribution layer.

BRIEF DESCRIPTION OF THE DRAWINGS

The inventive concepts will become more apparent in view of the attached drawings and accompanying detailed description.

DETAILED DESCRIPTION

Figure 1:
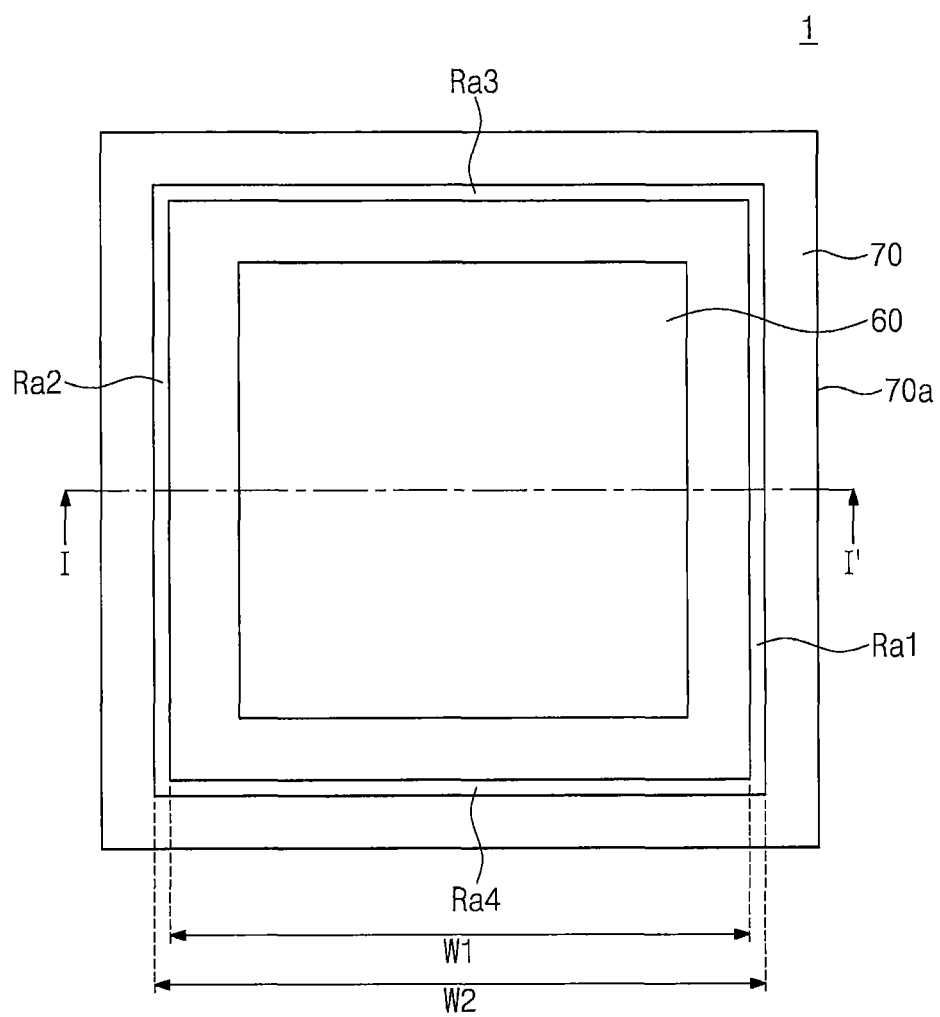
FIG. 1 is a plan view illustrating a semiconductor package according to some embodiments of the inventive concepts.

The same reference numerals or the same reference designators may denote the same elements or components throughout the specification. Semiconductor packages according to some embodiments of the inventive concepts will be described hereinafter in detail.

Figure 2:
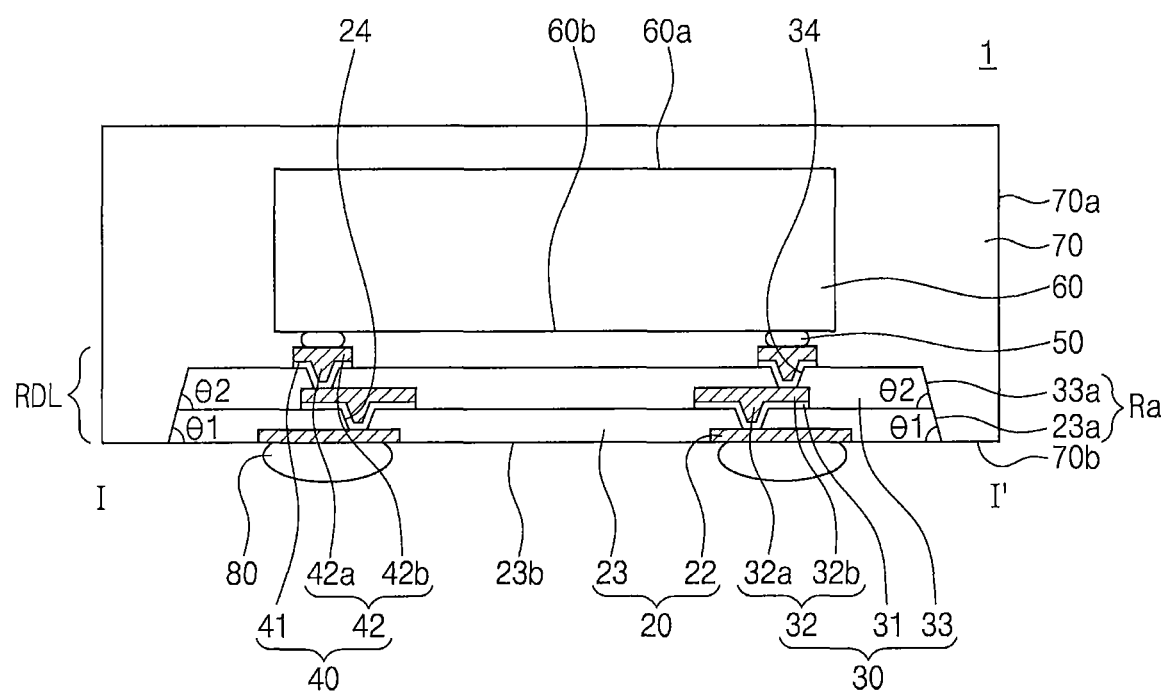
FIG. 2 is a cross-sectional view taken along a line I-I' of FIG. 1.

FIG. 1 is a plan view illustrating a semiconductor package according to some embodiments of the inventive concepts. FIG. 2 is a cross-sectional view taken along a line I-I' of FIG. 1.

Referring to FIGS. 1 and 2, a semiconductor package 1 may include a redistribution layer RDL, a solder bump 50, a semiconductor chip 60, a molding layer 70, and an external terminal 80.

The redistribution layer RDL may be provided between a bottom or lower surface 60b of the semiconductor chip 60 and the external terminal 80. The redistribution layer RDL may include a first interconnection layer 20, a second interconnection layer 30, and a chip connection part 40. Even though not shown in the drawings, the redistribution layer RDL may further include a plurality of interconnection layers.

The first interconnection layer 20 may be provided on a top or upper surface of the external terminal 80. The first interconnection layer 20 may include a first conductive pattern 22 and a first insulating layer 23. The first conductive pattern 22 may be provided on the top surface of the external terminal 80. The first conductive pattern 22 may include a conductive material. For example, the first conductive pattern 22 may include copper (Cu), a copper alloy, titanium (Ti), and/or aluminum (Al). The first conductive pattern 22 may be electrically connected to the external terminal 80. In the present specification, it may be understood that when a component is electrically connected to another component, it may be connected directly or indirectly to the other component. The first insulating layer 23 may be provided on the first conductive pattern 22. In more detail, the first insulating layer 23 may cover a top or upper surface and sidewalls or side surfaces of the first conductive pattern 22. The first insulating layer 23 may have a first through-hole 24. The first through-hole 24 may be provided on the top surface of the first conductive pattern 22. The first through-hole 24 may expose at least a portion of the top surface of the first conductive pattern 22. The first insulating layer 23 may include a curable material. The curable material may include an inorganic material (e.g., silicon oxide, silicon nitride, and/or silicon oxynitride) and/or a polyamide-based polymer material. For example, the curable material may include at least one of photosensitive polyimide (PSPI), polybenzoxazole (PBO), phenol polymer, benzocyclobutene (BCB) polymer, or epoxy polymer.

The second interconnection layer 30 may be provided on the first insulating layer 23. The second interconnection layer 30 may include a second seed layer 31, a second conductive pattern 32, and a second insulating layer 33. The second conductive pattern 32 may include a via portion 32a and a pad portion 32b. The second seed layer 31 may be disposed between the second conductive pattern 32 and the first insulating layer 23. In more detail, the second seed layer 31 may conformally cover a bottom or lower surface and inner sidewalls or inner side surfaces of the first through-hole 24 and a portion of a bottom or lower surface of the pad portion 32b of the second conductive pattern 32. The second seed layer 31 may include a conductive material. For example, the second seed layer 31 may include titanium (Ti), copper (Cu), and/or titanium nitride (TiN). The second conductive pattern 32 may be provided on the second seed layer 31. The second conductive pattern 32 may have a T-shaped cross section or substantially T-shaped cross section. The second conductive pattern 32 may be electrically connected to the first conductive pattern 22 through the second seed layer 31. In more detail, the via portion 32a of the second conductive pattern 32 may penetrate a portion of the first insulating layer 23 so as to be connected to the second seed layer 31. The second insulating layer 33 may be provided on the second conductive pattern 32. In more detail, the second insulating layer 33 may cover a top or upper surface and sidewalls or side surfaces of the second conductive pattern 32. The second insulating layer 33 may have a second through-hole 34. The second through-hole 34 may expose at least a portion of the top surface of the second conductive pattern 32. The second insulating layer 33 may include the same material as the first insulating layer 23. The second insulating layer 33 may include a curable material. The curable material may include an inorganic material (e.g., silicon oxide, silicon nitride, and/or silicon oxynitride) and/or a polyamide-based polymer material. For example, the curable material may include at least one of photosensitive polyimide (PSPI), polybenzoxazole (PBO), phenol polymer, benzocyclobutene (BCB) polymer, or epoxy polymer.

The chip connection part 40 may be provided on the second insulating layer 33. The chip connection part 40 may include a third seed layer 41 and a third conductive pattern 42. The third conductive pattern 42 may include a via portion 42a and a pad portion 42b. The third seed layer 41 may be disposed between the third conductive pattern 42 and the second insulating layer 33. In more detail, the third seed layer 41 may conformally cover a bottom or lower surface and inner sidewalls or inner side surfaces of the second through-hole 34 and a portion of a bottom or lower surface of the pad portion 42b of the third conductive pattern 42. The third seed layer 41 may include the same material as the second seed layer 31. For example, the third seed layer 41 may include titanium (Ti), copper (Cu), and/or titanium nitride (TiN). The third conductive pattern 42 may be provided on the third seed layer 41. The third conductive pattern 42 may have a T-shaped cross section or substantially T-shaped cross section. The third conductive pattern 42 may be electrically connected to the second conductive pattern 32 through the third seed layer 41. In more detail, the via portion 42a of the third conductive pattern 42 may penetrate a portion of the second insulating layer 33 so as to be connected to the third seed layer 41. The third conductive pattern 42 may be electrically connected to semiconductor devices in the semiconductor chip 60. The chip connection part 40 may be provided as a plurality of chip connection parts 40.

The solder bump 50 may be provided on the third conductive pattern 42. The solder bump 50 may include a conductive material. For example, the solder bump 50 may include copper (Cu), nickel (Ni), aluminum (Al), and/or titanium (Ti).

The semiconductor chip 60 may be mounted on the redistribution layer RDL through the solder bump 50. The semiconductor chip 60 may be an application processor (AP) chip, a memory chip, a radio frequency (RF) chip, a logic chip, or a graphic chip. The semiconductor chip 60 may include semiconductor devices therein. Circuit elements in the semiconductor chip 60 may be disposed adjacent to the bottom or lower surface 60b of the semiconductor chip 60. The bottom surface 60b of the semiconductor chip 60 may be an active surface.

The molding layer 70 may be provided on the semiconductor chip 60 and the redistribution layer RDL. In more detail, the molding layer 70 may seal the semiconductor chip 60. For example, the molding layer 70 may cover a top or upper surface 60a and sidewalls or side surfaces of the semiconductor chip 60. One sidewall of the molding layer 70 may be spaced apart from one sidewall of the redistribution layer RDL. A distance between the one sidewall of the molding layer 70 and the one sidewall of the redistribution layer RDL may decrease as a vertical distance from a bottom surface of the redistribution layer RDL decreases (e.g., a distance between the sidewall of the molding layer 70 and the sidewall of the redistribution layer RDL may increase in an upward vertical direction). The molding layer 70 may also be disposed between the bottom surface 60b of the semiconductor chip 60 and a top or upper surface of the second insulating layer 33. An edge portion of the molding layer 70 may extend onto sidewalls Ra of the redistribution layer RDL to cover the sidewalls Ra of the redistribution layer RDL. The molding layer 70 may include a polymer material. For example, the molding layer 70 may include epoxy. The molding layer 70 may protect the semiconductor chip 60 from external heat, moisture and/or impact.

The molding layer 70 may have a plurality of sidewalls, e.g., when viewed in a plan view. The redistribution layer RDL may have a plurality of the sidewalls Ra. Each of the sidewalls of the molding layer 70 may face a corresponding one of the sidewalls Ra of the redistribution layer RDL. In some embodiments, the sidewalls Ra of the redistribution layer RDL may include sidewalls 23a of the first insulating layer 23 and sidewalls 33a of the second insulating layer 33. Like FIG. 1, the sidewalls Ra of the redistribution layer RDL may include a first sidewall Ra1, a second sidewall Ra2, a third sidewall Ra3, and a fourth sidewall Ra4, e.g., when viewed in a plan view. The second sidewall Ra2 may be opposite to the first sidewall Ra1, and the third sidewall Ra3 may be perpendicular or substantially perpendicular to the first sidewall Ra1, e.g., when viewed in a plan view. The fourth sidewall Ra4 may be opposite to the third sidewall Ra3. The edge portion of the molding layer 70 may surround the first to fourth sidewalls Ra1 to Ra4 of the redistribution layer RDL. Accordingly, the first to fourth sidewalls Ra1 to Ra4 may be spaced apart from the sidewalls 70a of the molding layer 70, and thus the sidewalls Ra of the redistribution layer RDL may not be exposed to the outside. If the sidewalls Ra of the redistribution layer RDL are exposed to the outside, corner portions at which the sidewalls Ra of the redistribution layer RDL meet the bottom surface of the redistribution layer RDL may be damaged by an external impact. In the semiconductor package according to the embodiments of the inventive concepts, the sidewalls Ra of the redistribution layer RDL may be sealed by the molding layer 70, and thus reliability of the semiconductor package on an external impact may be improved.

The sidewalls Ra of the redistribution layer RDL may be inclined (not perpendicular) with respect to the bottom or lower surface of the redistribution layer RDL. Each of angles between the bottom surface of the redistribution layer RDL and the sidewalls Ra of the redistribution layer RDL may be an acute angle. For example, each of the angles between the bottom surface of the redistribution layer RDL and the sidewalls Ra of the redistribution layer RDL may be equal to or greater than 45 degrees and less than 90 degrees. In more detail, the sidewalls 23a of the first insulating layer 23 and the sidewalls 33a of the second insulating layer 33 may be inclined with respect to a bottom surface 23b of the first insulating layer 23. An angle $\theta 1$ between the bottom surface 23b of the first insulating layer 23 and each of the sidewalls 23a of the first insulating layer 23 may be a first angle $\theta 1$. The first angle $\theta 1$ may be an acute angle. For example, the first angle $\theta 1$ may be equal to or greater than 45 degrees and less than 90 degrees. An angle $\theta 2$ between the bottom surface 23b of the first insulating layer 23 (or a top or upper surface of the first insulating layer 23) and each of the sidewalls 33a of the second insulating layer 33 may be a second angle $\theta 2$. The second angle $\theta 2$ may be equal to the first angle $\theta 1$. Thus, the sidewalls 23a of the first insulating layer 23 may be coplanar with the sidewalls 33a of the second insulating layer 33. The second angle $\theta 2$ may be an acute angle. For example, the second angle $\theta 2$ may be equal to or greater than 45 degrees and less than 90 degrees.

Like FIGS. 1 and 2, the first to fourth sidewalls Ra1 to Ra4 of the redistribution layer RDL may be inclined with respect to the bottom surface of the redistribution layer RDL. In more detail, angles between the bottom surface of the redistribution layer RDL and the first to fourth sidewalls Ra1 to Ra4 may be acute angles. For example, each of the angles may be equal to or greater than 45 degrees and less than 90 degrees. The angles between the bottom surface of the redistribution layer RDL and the first to fourth sidewalls Ra1 to Ra4 may be equal to the first angle $\theta 1$ or the second angle $\theta 2$.

The bottom surface of the redistribution layer RDL may include the bottom or lower surface 23b of the first insulating layer 23. The bottom surface of the redistribution layer RDL may be provided at the same level as a bottom surface 70b of the edge portion of the molding layer 70 and thus may be coplanar with the bottom surface 70b of the edge portion of the molding layer 70. A width W2 of the bottom surface of the redistribution layer RDL may be greater than a width W1 of the top surface of the redistribution layer RDL. In some embodiments, a distance between the first sidewall Ra1 and the second sidewall Ra2 of the redistribution layer RDL may decrease as a distance from the bottom surface of the semiconductor chip 60 decreases. In certain embodiments, a distance between the third sidewall Ra3 and the fourth sidewall Ra4 of the redistribution layer RDL may decrease as a distance from the bottom surface of the semiconductor chip 60 decreases. The distance between the third sidewall Ra3 and the fourth sidewall Ra4 of the redistribution layer RDL may decrease in an upward vertical direction.

Figure 3:
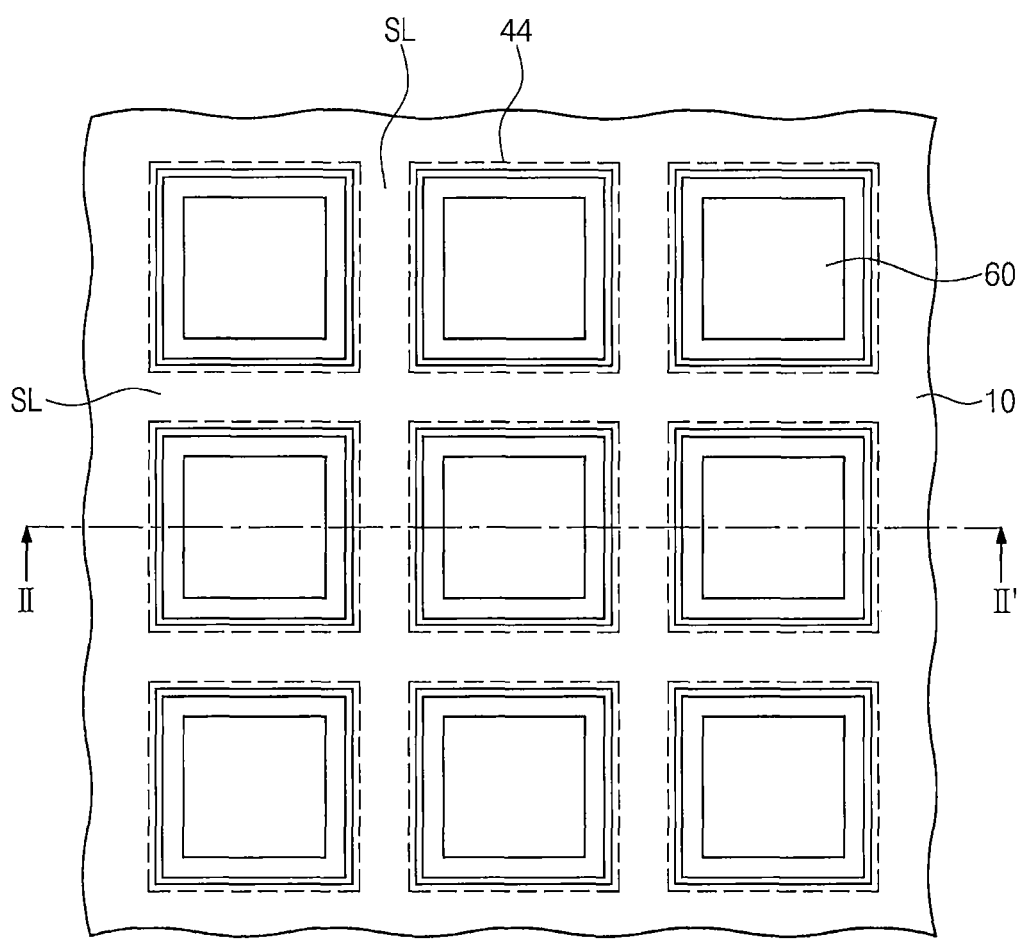
FIG. 3 is a plan view illustrating a method for manufacturing a semiconductor package according to some embodiments of the inventive concepts.

FIG. 3 is a plan view illustrating a method for manufacturing a semiconductor package according to some embodiments of the inventive concepts. FIGS. 4 to 15 are cross-sectional views illustrating a method for manufacturing a semiconductor package according to some embodiments of the inventive concepts.

Figure 4:
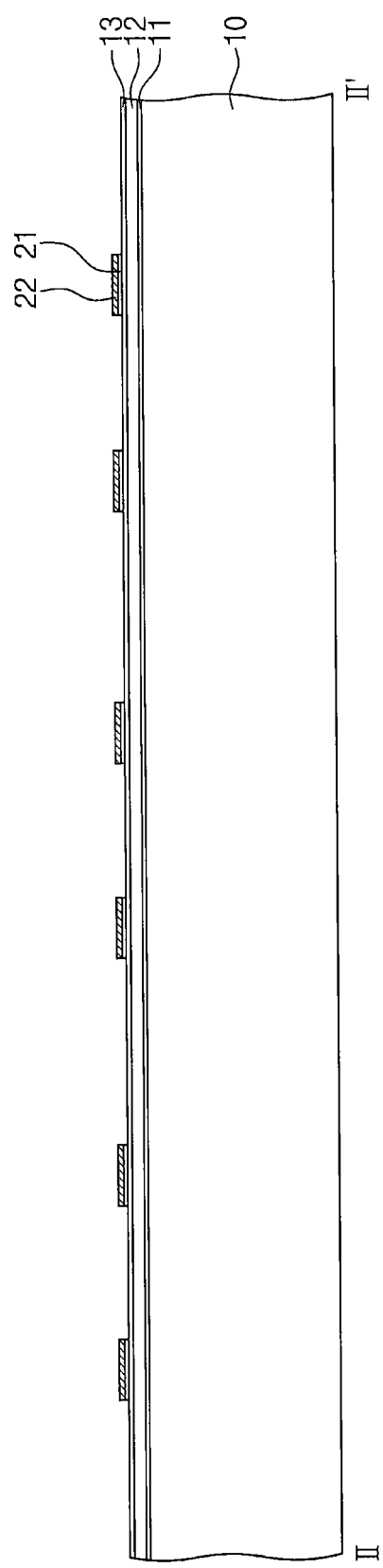
FIGS. 4 to 15 are cross-sectional views illustrating a method for manufacturing a semiconductor package according to some embodiments of the inventive concepts.

Referring to FIG. 4, a carrier substrate 10 may be prepared. The carrier substrate 10 may be a single-crystalline silicon substrate or a silicon-on-insulator (SOI) substrate. An adhesive layer 11 may be formed on a top or upper surface of the carrier substrate 10. The adhesive layer 11 may include a polymer material. Adhesive strength between the adhesive layer 11 and the carrier substrate 10 or between the adhesive layer 11 and a temporary insulating layer 12 may be changed by heat or light. Thus, light or heat may be applied to the adhesive layer 11, and then, the carrier substrate 10 may be removed. A temporary insulating layer 12 may be formed on a top or upper surface of the adhesive layer 11. The temporary insulating layer 12 may include an inorganic material and/or a polymer material. For example, the inorganic material may include silicon oxide, silicon nitride, and/or silicon oxynitride, and the polymer material may include a polyamide-based polymer material. However, embodiments of the inventive concepts are not limited thereto. In the event that the temporary insulating layer 12 is disposed between the carrier substrate 10 and a redistribution layer to be described below, the temporary insulating layer 12 may protect the redistribution layer from heat, light or impact when the carrier substrate 10 is removed. An etch stop layer 13 may be formed on a top or upper surface of the temporary insulating layer 12. The etch stop layer 13 may define a level of a bottom or lower surface of a through portion 44 of the redistribution layer to be described below. The etch stop layer 13 may include a metal and/or a metal nitride. For example, the etch stop layer 13 may include, but not limited to, titanium (Ti), copper (Cu), and/or titanium nitride (TiN).

A first conductive pattern 22 may be formed on the etch stop layer 13. For example, a first seed layer 21 may be formed on a top or upper surface of the etch stop layer 13. An etch mask having a through-hole may be formed on a top or upper surface of the first seed layer 21. The through-hole may define a region in which the first conductive pattern 22 will be formed. The first conductive pattern 22 may be formed by filling the through-hole with a conductive material through a plating process. Thereafter, the etch mask and a portion of the first seed layer 21 may be removed. The first seed layer 21 between the etch stop layer 13 and the first conductive pattern 22 may not be removed. Thus, the first seed layer 21 may remain between the etch stop layer 13 and the first conductive pattern 22. Alternatively, a conductive material may be deposited on the carrier substrate 10, and then, the deposited conductive material may be patterned to form the first conductive pattern 22.

Figure 5:
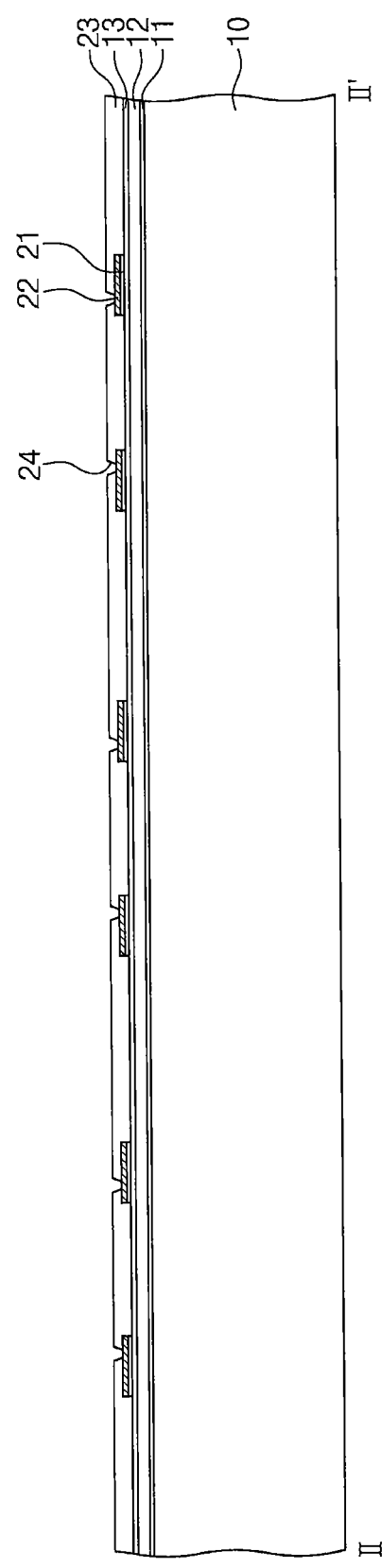

Referring to FIG. 5, a first insulating layer 23 may be formed on the first conductive pattern 22 and the etch stop layer 13. For example, the first insulating layer 23 may be formed by applying or depositing a sealing material on the first conductive pattern 22 and the etch stop layer 13. The first insulating layer 23 may be formed using a plasma enhanced chemical vapor deposition (PECVD) process, a high density plasma CVD (HDPCVD) process, an atmospheric pressure CVD (APCVD) process, or a spin-coating process. The first insulating layer 23 may cover the first conductive pattern 22 and the etch stop layer 13. In more detail, the first insulating layer 23 may cover a top or upper surface and sidewalls or side surfaces of the first conductive pattern 22 and a top or upper surface of the etch stop layer 13 and may surround sidewalls or side surfaces of the first seed layer 21. A hardening process may be performed on the first insulating layer 23 as needed.

A first through-hole 24 may be formed in the first insulating layer 23. For example, an etching process may be performed on the first insulating layer 23 to form the first through-hole 24. The first through-hole 24 may be formed on or above the first conductive pattern 22. An upper portion of the first insulating layer 23 may be over-etched by the etching process. Thus, the first through-hole 24 may have a tapered shape of which a width increases as a distance from the first conductive pattern 22 increases (e.g., the width of the first through-hole 24 may increase in an upward vertical direction). The first through-hole 24 may penetrate at least a portion of the first insulating layer 23 to expose at least a portion of a top or upper surface of the first conductive pattern 22. The first through-hole 24 may define a region in which a via portion 32a of a second conductive pattern 32 to be described below will be formed.

Figure 6:
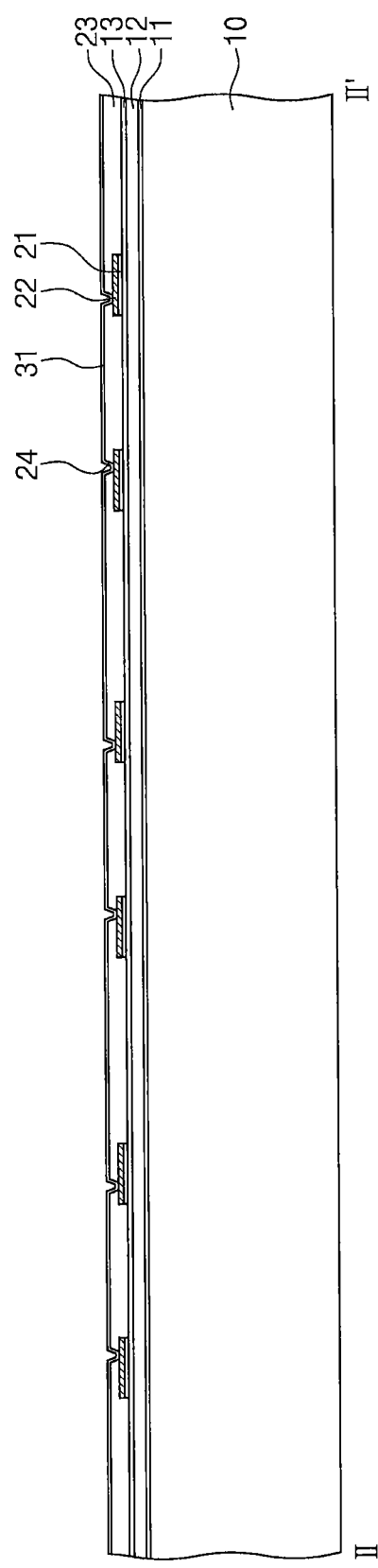

Referring to FIG. 6, a second seed layer 31 may be formed on the first insulating layer 23. In more detail, the second seed layer 31 may be formed along a top or upper surface of the first insulating layer 23 and a bottom or lower surface and inner sidewalls or inner side surfaces of the first through-hole 24. Thus, the second seed layer 31 may conformally cover the top surface of the first insulating layer 23 and the bottom surface and the inner sidewalls of the first through-hole 24.

Figure 7:
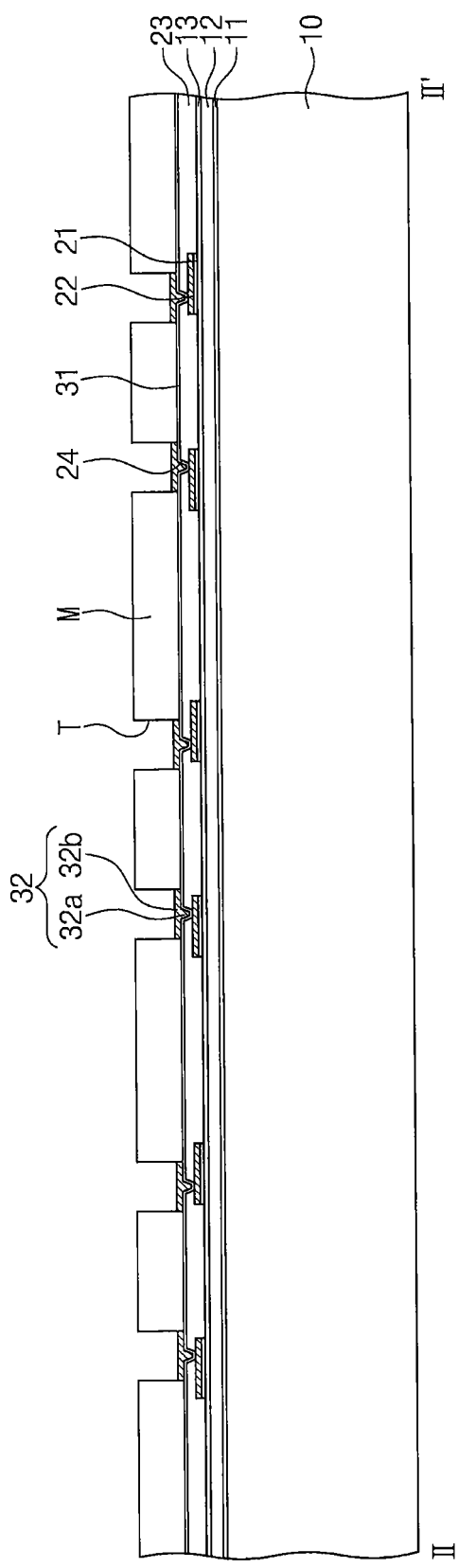

Referring to FIG. 7, a mask layer M may be formed on the second seed layer 31. For example, the mask layer M may be formed by coating a top surface of the second seed layer 31 with a mask material. A through-hole T may be formed in the mask layer M. The through-hole T may be formed on or above the first through-hole 24. The through-hole T may expose the second seed layer 31 disposed on the bottom surface and the inner sidewalls of the first through-hole 24. The through-hole T may define a region in which a second conductive pattern 32 will be formed. A size of a shape of the through-hole T may be equal to or greater than a size of a shape of the first through-hole 24 when viewed in a plan view.

The second conductive pattern 32 may be formed on the exposed portion of the second seed layer 31. The second conductive pattern 32 may include a via portion 32a and a pad portion 32b. The via portion 32a may be formed by filling the first through-hole 24 with a conductive material. For example, a plating process of filling the first through-hole 24 with the conductive material may be performed using the second seed layer 31, formed on the bottom surface and the inner sidewalls of the first through-hole 24, as a seed. Due to the shape of the first through-hole 24, the via portion 32a of the second conductive pattern 32 may have a tapered shape of which a width increases as a distance from the first conductive pattern 22 increases (e.g., the width of the via portion 32a of the second conductive pattern 32 may increase in an upward vertical direction). The pad portion 32b of the second conductive pattern 32 may be formed by filling at least a portion of the through-hole T with a conductive material. For example, a plating process of filling at least a portion of the through-hole T with the conductive material may be performed using the via portion 32a of the second conductive pattern 32, exposed by the through-hole T, as a seed. In the above descriptions, the process of forming the via portion 32a and the process of forming the pad portion 32b are described separately from each other. However, the process of forming the via portion 32a and the process of forming the pad portion 32b may be performed continuously, and the via portion 32a and the pad portion 32b may be formed as a single unitary body.

Figure 8:
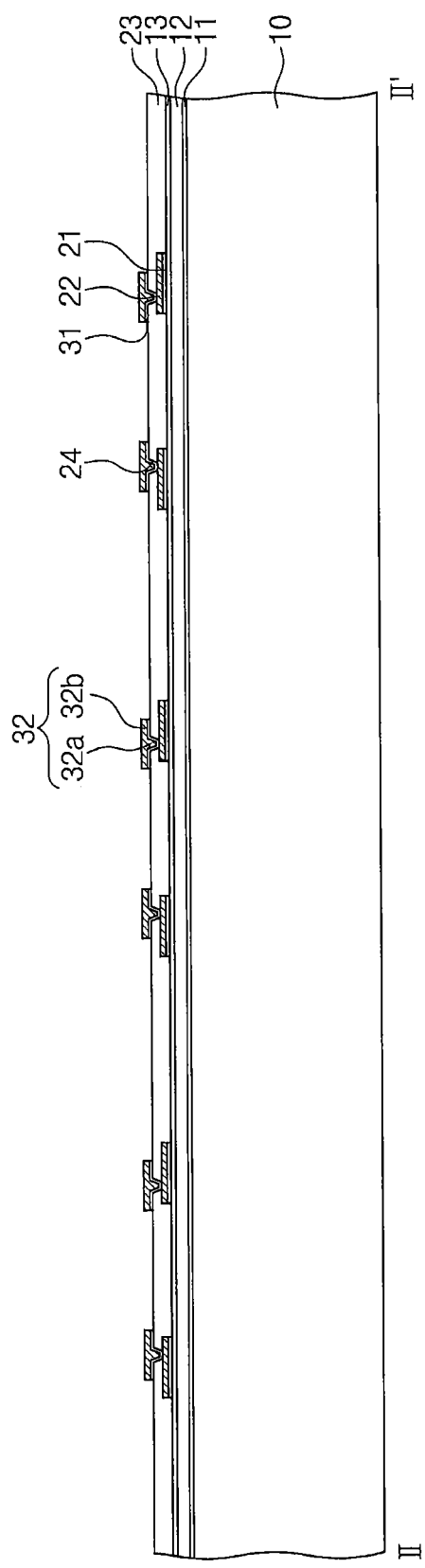

Referring to FIG. 8, the mask layer M and a portion of the second seed layer 31 may be removed. In more detail, the second seed layer 31 between the first insulating layer 23 and the second conductive pattern 32 may not be removed. Thus, the second seed layer 31 may be disposed between the first insulating layer 23 and the second conductive pattern 32.

Figure 9:
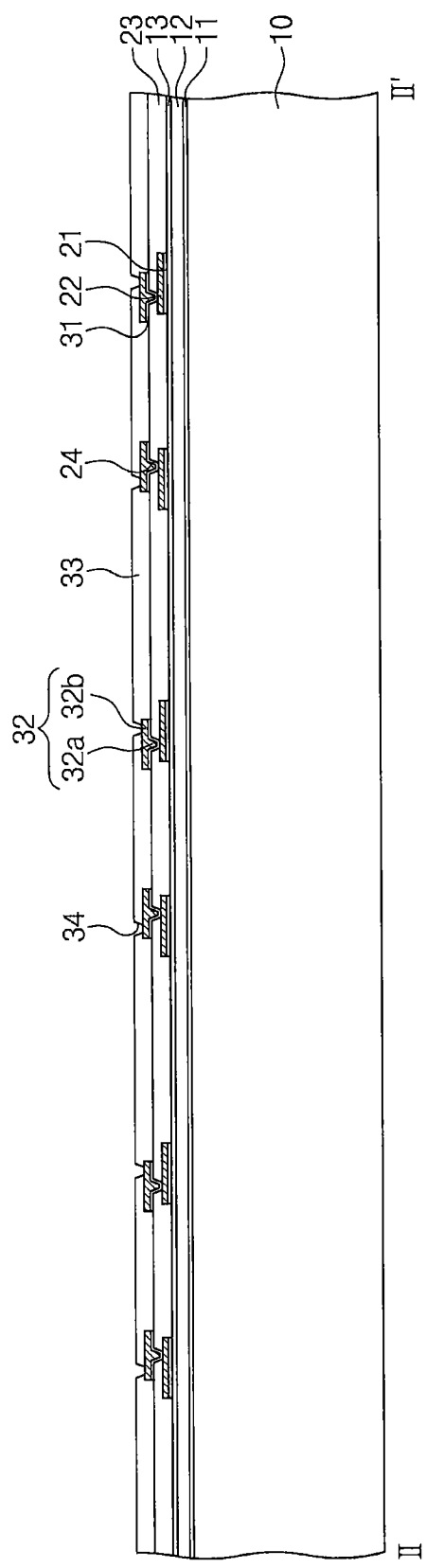

Referring to FIG. 9, a second insulating layer 33 may be formed on the first insulating layer 23 and the second conductive pattern 32. The second insulating layer 33 may be formed by the same method as the first insulating layer 23. For example, the second insulating layer 33 may be formed by applying or depositing a sealing material on the second conductive pattern 32 and the first insulating layer 23. The second insulating layer 33 may be formed using a plasma enhanced chemical vapor deposition (PECVD) process, a high density plasma CVD (HDPCVD) process, an atmospheric pressure CVD (APCVD) process, or a spin-coating process. A hardening process may be performed on the second insulating layer 33 as needed.

A second through-hole 34 may be formed in the second insulating layer 33. The second through-hole 34 may be formed by the same method as the first through-hole 24. For example, an etching process may be performed on the second insulating layer 33 to form the second through-hole 34. The second through-hole 34 may be formed on or above the second conductive pattern 32. An upper portion of the second insulating layer 33 may be over-etched by the etching process. Thus, the second through-hole 34 may have a tapered shape of which a width increases as a distance from the second conductive pattern 32 increases (e.g., the width of the second through-hole 34 may increase in an upward vertical direction). The second through-hole 34 may penetrate the second insulating layer 33 to expose at least a portion of a top or upper surface of the second conductive pattern 32. The second through-hole 34 may define a region in which a via portion 42a of a third conductive pattern 42 to be described below will be formed.

Figure 10:
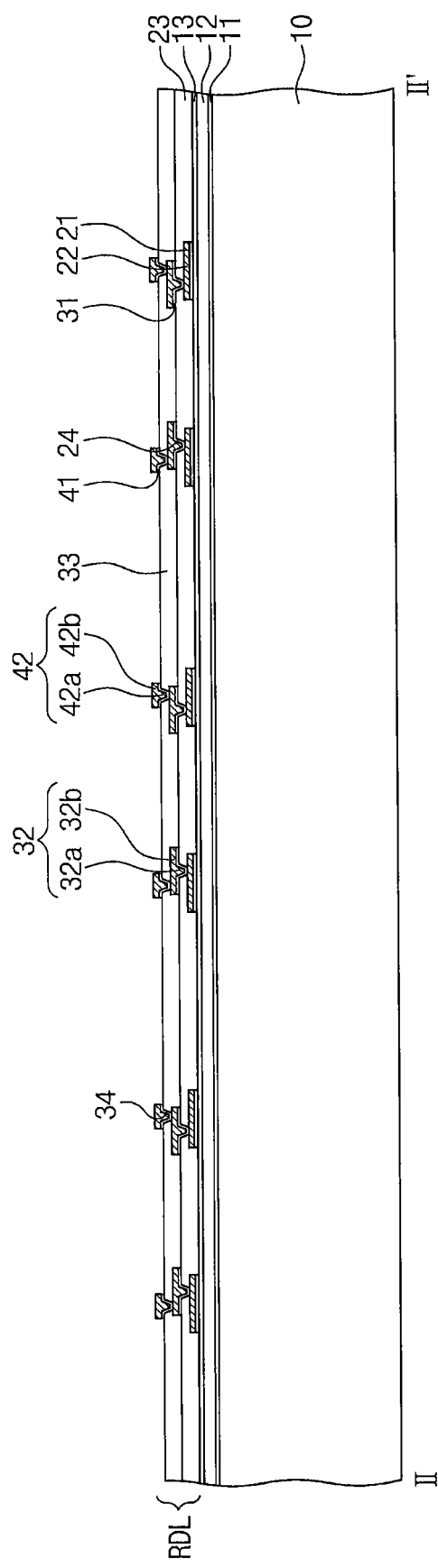

Referring to FIG. 10, a third conductive pattern 42 may be formed on the second insulating layer 33. The third conductive pattern 42 may be formed by the same method as the second conductive pattern 32. For example, a third seed layer 41 may be formed on the second insulating layer 33. In more detail, the third seed layer 41 may be formed along a top or upper surface of the second insulating layer 33 and a bottom or lower surface and inner sidewalls or inner side surfaces of the second through-hole 34. Thus, the third seed layer 41 may conformally cover the top surface of the second insulating layer 33 and the bottom surface and the inner sidewalls of the second through-hole 34.

A mask layer may be formed on the third seed layer 41. For example, the mask layer may be formed by coating a top surface of the third seed layer 41 with a mask material. A through-hole may be formed in the mask layer. The through-hole may expose the third seed layer 41 disposed on the bottom surface and the inner sidewalls of the second through-hole 34. A size of a shape of the through-hole may be equal to or greater than a size of a shape of the second through-hole 34 when viewed in a plan view.

The third conductive pattern 42 may be formed on the exposed portion of the third seed layer 41. The third conductive pattern 42 may include a via portion 42a and a pad portion 42b. A plating process of filling the second through-hole 34 with a conductive material may be performed using the third seed layer 41, formed on the bottom surface and the inner sidewalls of the second through-hole 34, as a seed, and thus the via portion 42a may be formed. Due to the shape of the second through-hole 34, the via portion 42a of the third conductive pattern 42 may have a tapered shape of which a width increases as a distance from the second conductive pattern 32 increases (e.g., the width of the via portion 42a of the third conductive pattern 42 may increase in an upward vertical direction). The pad portion 42b of the third conductive pattern 42 may be formed by filling at least a portion of the through-hole with a conductive material. In the above descriptions, the process of forming the via portion 42a and the process of forming the pad portion 42b are described separately from each other. However, the process of forming the via portion 42a and the process of forming the pad portion 42b may be performed continuously, and the via portion 42a and the pad portion 42b may be formed as a single unitary body.

Figure 11:
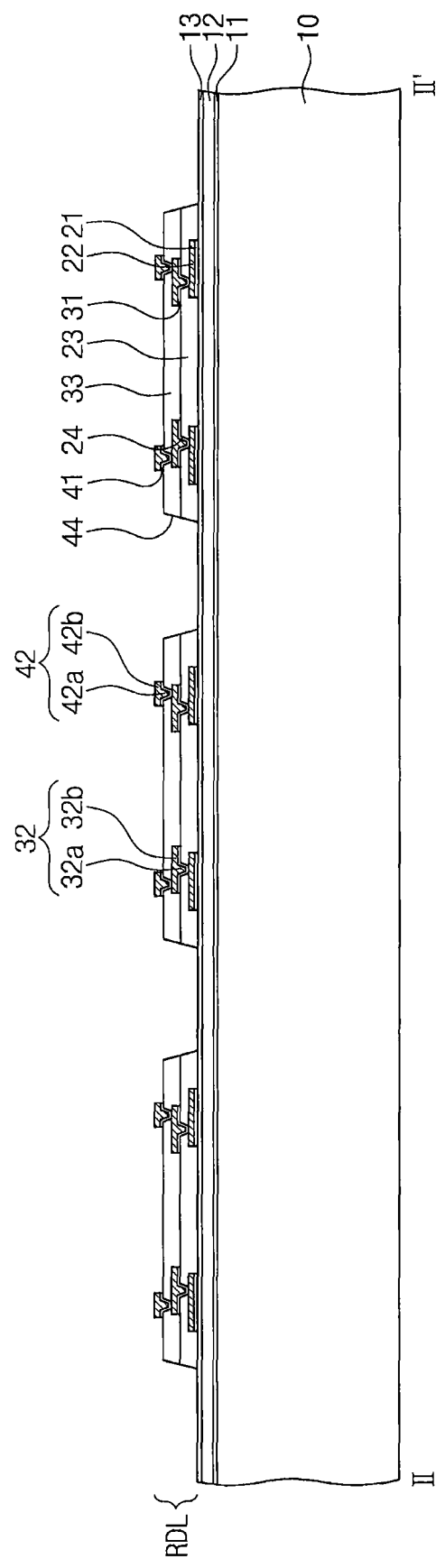

Referring to FIGS. 3 and 11, the first insulating layer 23 and the second insulating layer 33 may be etched to form a through portion 44. For example, a mask having a hole may be prepared on the first and second insulating layers 23 and 33. Laser may be used in the etching process. For example, the laser may be irradiated toward the first and second insulating layers 23 and 33 through the mask. The laser transmitted through the hole of the mask may etch the first and second insulating layers 23 and 33 to form the through portion 44. The laser may be an ultraviolet laser using a gas in which an inert gas is mixed with a halogen gas. For example, the laser may be argon fluoride (ArF) excimer laser, krypton fluoride (KrF) excimer laser, xenon chloride (XeCl) excimer laser, and/or xenon fluoride (XeF) excimer laser. A wavelength of the laser may range from 150 nm to 400 nm. Since a coefficient of thermal expansion of the redistribution layer RDL is different from a coefficient of thermal expansion of the carrier substrate 10, a warpage phenomenon of the redistribution layer RDL may occur in the process of manufacturing a semiconductor package. When the redistribution layer RDL has the through portion 44, the redistribution layer RDL may become softer or more flexible, and thus the warpage phenomenon of the redistribution layer RDL may be reduced or minimized. As a result, the reliability of the semiconductor package may be improved.

Figure 12:
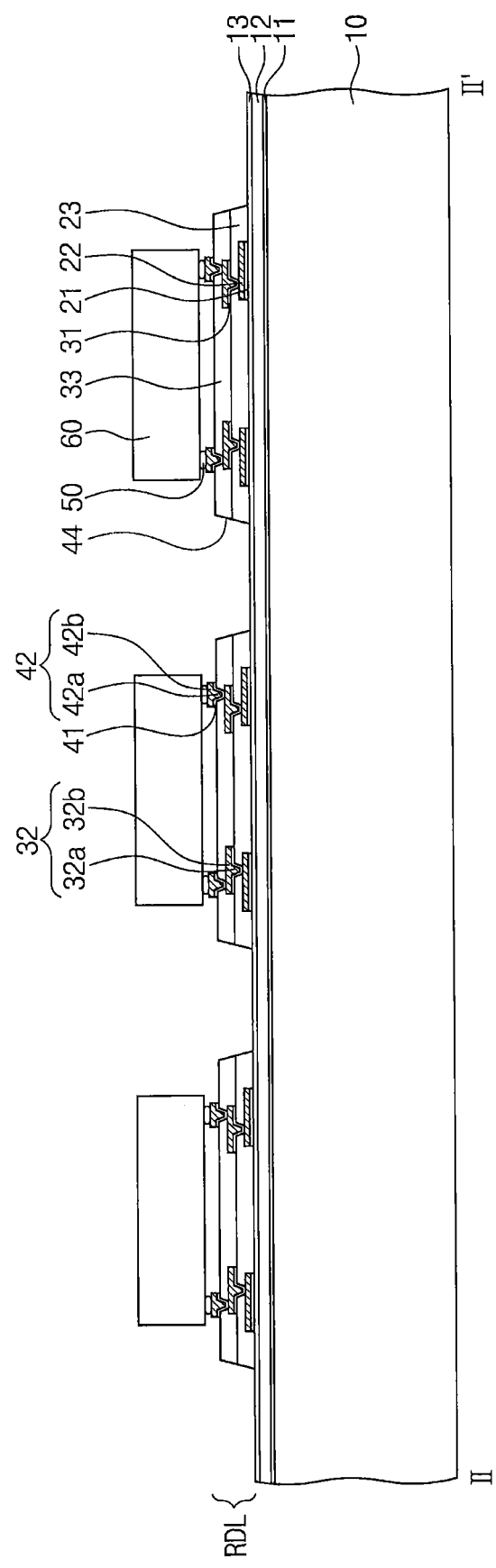

Referring to FIG. 12, a semiconductor chip 60 may be mounted on the third conductive pattern 42. In more detail, a solder bump 50 may be formed on a top or upper surface of the third conductive pattern 42. The semiconductor chip 60 may be mounted on the solder bump 50. For example, the semiconductor chip 60 may be connected to the solder bump 50 by a flip chip method.

Figure 13:
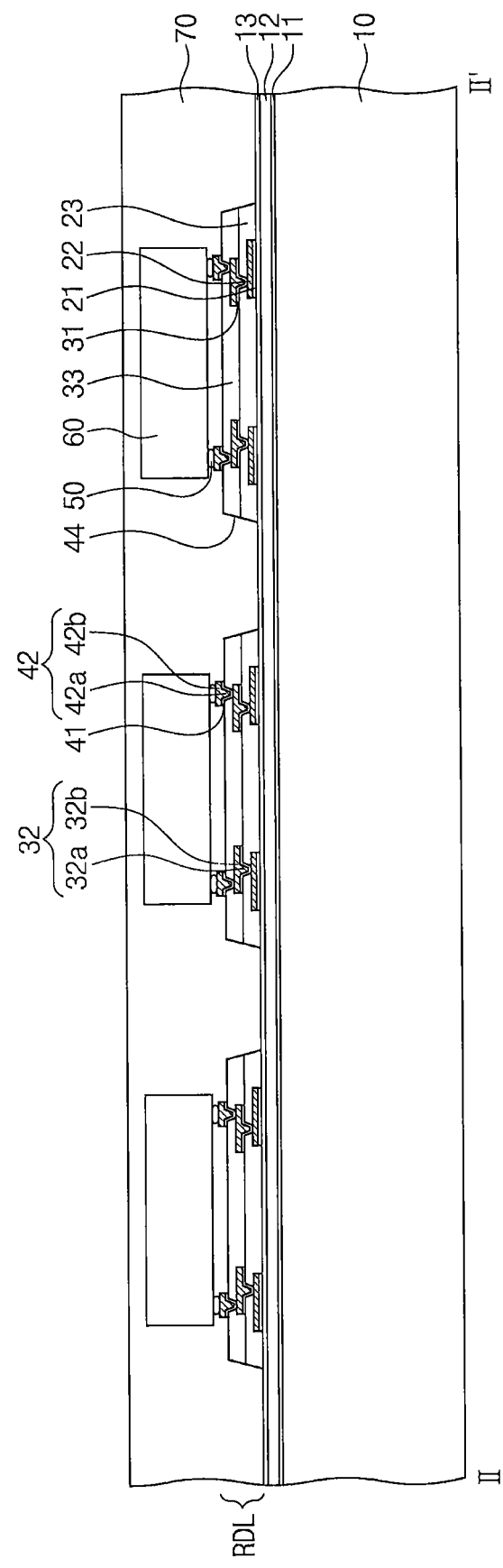

Referring to FIG. 13, a molding layer 70 may be formed on the carrier substrate 10, the first insulating layer 23, the second insulating layer 33, and the semiconductor chip 60. For example, an insulating material may be supplied onto the carrier substrate 10 to cover the semiconductor chip 60, and thus the molding layer 70 may be formed.

Figure 14:
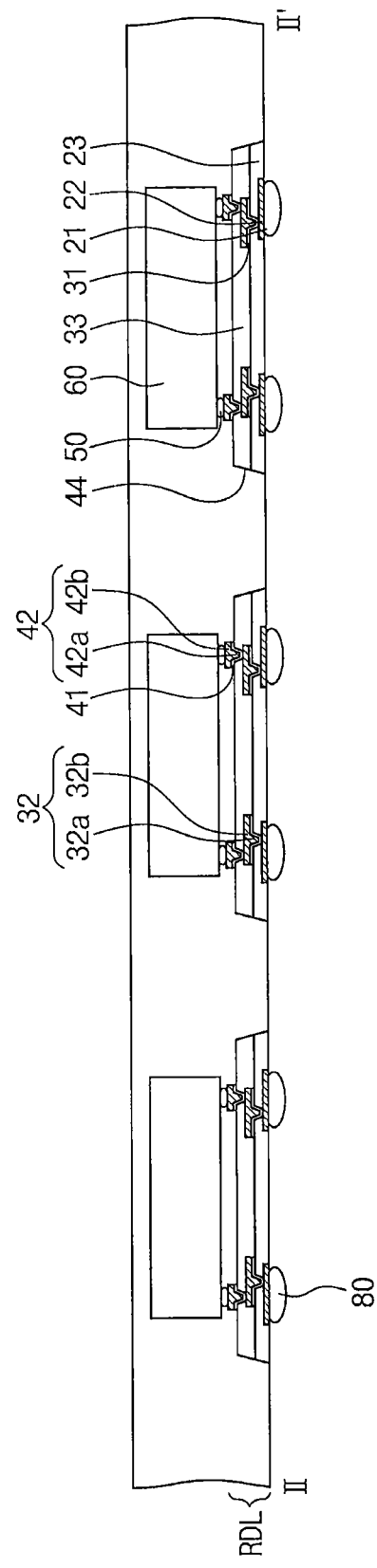

Referring to FIG. 14, the carrier substrate 10, the adhesive layer 11, the temporary insulating layer 12, the etch stop layer 13 and the first seed layer 21 may be removed. Thus, a bottom surface of the first conductive pattern 22 may be exposed. An external terminal 80 may be formed on the bottom or lower surface of the first conductive pattern 22.

Figure 15:
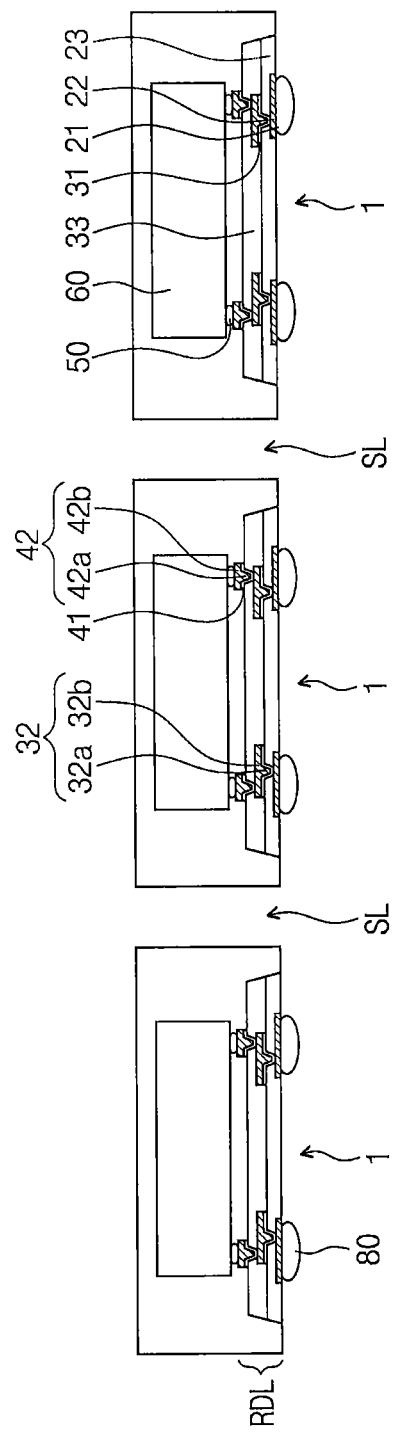

Referring to FIGS. 3 and 15, the resultant structure of FIG. 14 may be divided into semiconductor packages 1. In more detail, the molding layer 70 between the semiconductor chips 60 may be cut along a scribe lane SL. The cutting process may be performed using a blade. The blade may be or include, but is not limited to, a diamond blade. If the redistribution layer RDL does not have the through portion 44, the blade for cutting may cut both the molding layer 70 and the redistribution layer RDL. Since the redistribution layer RDL is more brittle than the molding layer 70, a crack may be generated at a contact surface when the blade comes in contact with the redistribution layer RDL. When the redistribution layer RDL has the through portion 44, the blade for cutting may not be in direct contact with the redistribution layer RDL but may cut the molding layer 70. Thus, a crack may not be generated at the redistribution layer RDL. Since one sidewall 70a of the molding layer 70 is in contact with the blade in the cutting process, a surface roughness of the one sidewall 70a of the molding layer 70 may be greater than a surface roughness of one sidewall Ra of the redistribution layer RDL. The semiconductor packages 1 may be manufactured by the processes described above.

According to the embodiments of the inventive concepts, the sidewalls of the redistribution layer of the semiconductor package may be covered by the molding layer, and thus damage of the redistribution layer by the blade in the cutting process may be reduced or prevented. As a result, the reliability of the semiconductor package may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
a redistribution layer;
a semiconductor chip on the redistribution layer; and
a molding layer covering a sidewall of the semiconductor chip and a top surface and a sidewall of the redistribution layer,
wherein the sidewall of the redistribution layer is inclined with respect to a bottom surface of the redistribution layer,
wherein a sidewall of the molding layer is spaced apart from the sidewall of the redistribution layer,
wherein the redistribution layer comprises a first insulating layer and a second insulating layer,
wherein a sidewall of the first insulating layer is coplanar with a sidewall of the second insulating layer,
wherein a bottom surface of an edge portion of the molding layer is coplanar with the bottom surface of the redistribution layer, and
wherein the bottom surface of the edge portion of the molding layer and the bottom surface of the redistribution layer are exposed.

2. The semiconductor package of claim 1, wherein a distance between the sidewall of the molding layer and the sidewall of the redistribution layer increases in an upward vertical direction.

3. The semiconductor package of claim 1, wherein an angle between the sidewall of the redistribution layer and the bottom surface of the redistribution layer is an acute angle.

4. The semiconductor package of claim 3, wherein the angle between the sidewall of the redistribution layer and the bottom surface of the redistribution layer is equal to or greater than 45 degrees and less than 90 degrees.

5. The semiconductor package of claim 1, wherein a surface roughness of the sidewall of the redistribution layer is less than a surface roughness of the sidewall of the molding layer.

6. The semiconductor package of claim 1, wherein the redistribution layer comprises a plurality of sidewalls, and
wherein the molding layer surrounds the plurality of sidewalls of the redistribution layer.

7. The semiconductor package of claim 6, wherein the molding layer comprises a plurality of sidewalls, and
wherein the sidewalls of the redistribution layer are spaced apart from the sidewalls of the molding layer.

8. The semiconductor package of claim 7, wherein each of the sidewalls of the molding layer faces a corresponding one of the sidewalls of the redistribution layer, and
wherein a distance between each of the sidewalls of the molding layer and the corresponding one of the sidewalls of the redistribution layer increases in an upward vertical direction.

9. The semiconductor package of claim 1, wherein the redistribution layer comprises:
a first interconnection layer;
a second interconnection layer on the first interconnection layer; and
a chip connection part between the second interconnection layer and the semiconductor chip,
wherein the bottom surface of the redistribution layer includes a bottom surface of the first interconnection layer,
wherein sidewalls of the first interconnection layer are coplanar with sidewalls of the second interconnection layer, and
wherein the chip connection part is under the semiconductor chip and the chip connection part and the semiconductor chip are vertically aligned.

10. The semiconductor package of claim 9, wherein the chip connection part comprises a plurality of chip connection parts, and
wherein the molding layer directly covers a bottom surface of the semiconductor chip and directly covers sidewalls of the plurality of chip connection parts.

11. A semiconductor package comprising:
a redistribution layer;
a semiconductor chip on the redistribution layer;
solder bumps between the semiconductor chip and the redistribution layer; and
a molding layer directly covering a top surface and directly surrounding sidewalls of the semiconductor chip,
wherein an edge portion of the molding layer directly covers sidewalls of the redistribution layer,
wherein each of the sidewalls of the redistribution layer forms an acute inclination angle with a bottom surface of the redistribution layer,
wherein sidewalls of the molding layer are planar and vertically oriented, and
wherein the sidewalls of the redistribution layer comprise:
a first sidewalk;
a second sidewall opposite the first sidewalk;
a third sidewall substantially perpendicular to the first sidewalk; and
a fourth sidewall opposite the third sidewall,
wherein the first to fourth sidewalls are spaced apart from the sidewalls of the molding layer.

12. The semiconductor package of claim 11, wherein a bottom surface of the edge portion of the molding layer is coplanar with the bottom surface of the redistribution layer, and
wherein the bottom surface of the edge portion of the molding layer and the bottom surface of the redistribution layer are exposed.

13. The semiconductor package of claim 11, wherein the redistribution layer comprises:
a first interconnection layer;
a second interconnection layer on the first interconnection layer; and
a chip connection part between the second interconnection layer and the semiconductor chip,
wherein the bottom surface of the redistribution layer includes a bottom surface of the first interconnection layer,
wherein a width of the bottom surface of the redistribution layer is greater than a width of a top surface of the redistribution layer, and
wherein the chip connection part is under the semiconductor chip and the chip connection part and the semiconductor chip are vertically aligned.

14. The semiconductor package of claim 13, wherein the redistribution layer comprises a first insulating layer and a second insulating layer,
wherein the first interconnection layer includes the first insulating layer,
wherein the second interconnection layer includes the second insulating layer, and
wherein each of the first and second insulating layers includes a photosensitive polymer.

15. The semiconductor package of claim 11, wherein the redistribution layer is surrounded by the edge portion of the molding layer.

16. The semiconductor package of claim 11, wherein a distance between a first sidewall and a second opposite sidewall of the redistribution layer decreases in an upward vertical direction.

17. A semiconductor package comprising:
a redistribution layer;
a semiconductor chip on the redistribution layer;
solder bumps between the semiconductor chip and the redistribution layer;
a molding layer covering sidewalls of the semiconductor chip and a top surface of the redistribution layer and surrounding sidewalls of the redistribution layer; and
external terminals on a bottom surface of the redistribution layer,
wherein the sidewalls of the redistribution layer comprise first to fourth sidewalls,
wherein the first to fourth sidewalls are spaced apart from sidewalls of the molding layer,
wherein an angle between the bottom surface of the redistribution layer and each of the first to fourth sidewalls is an acute angle,
wherein the semiconductor chip is electrically connected to the external terminals through the redistribution layer,
wherein a bottom surface of an edge portion of the molding layer is coplanar with the bottom surface of the redistribution layer,
wherein the redistribution layer comprises a first insulating layer and a second insulating layer, and wherein a sidewall of the first insulating layer is coplanar with a sidewall of the second insulating layer.

* * * * *